United States Patent [19]

Blumenau

[11] Patent Number: 5,457,380
[45] Date of Patent: Oct. 10, 1995

[54] CIRCUIT-TEST FIXTURE THAT INCLUDES SHORTED-TOGETHER PROBES

[75] Inventor: Steven M. Blumenau, Royalston, Mass.

[73] Assignee: GenRad, Inc., Concord, Mass.

[21] Appl. No.: 240,981

[22] Filed: May 11, 1994

[51] Int. Cl.$^6$ .................................................. G01R 31/28
[52] U.S. Cl. ........................................ 324/158.1; 324/757
[58] Field of Search .................................. 324/158.1, 757

[56] References Cited

U.S. PATENT DOCUMENTS 5,198,756  3/1993  Jenkins ........................................ 324/757
5,315,241  5/1994  Ewers ........................................ 324/158.1

*Primary Examiner*—Kenneth A. Wieder
*Assistant Examiner*—Mark Wardas
*Attorney, Agent, or Firm*—Cesari and McKenna

[57] ABSTRACT

In a fixture (24) are mounted a plurality of probes (28) so disposed as to enable them simultaneously to contact test points on a circuit board (26) to be subjected to an in-circuit test. Wiring (30) connects the probes (28) to respective fixture pins (22) that mate with the system pins (20) by which a general-purpose tester (12) provides connections to various test instruments (14). The wiring (20) is so provided that certain of the probes (28) are wired together and thus require fewer system pins (20) than there are probes (28).

3 Claims, 2 Drawing Sheets

CIRCUIT-TEST FIXTURE THAT INCLUDES SHORTED-TOGETHER PROBES

BACKGROUND OF THE INVENTION

The present invention is directed to the testing of electronic circuit boards and in particular to the fixtures used for in-circuit testing.

It is desirable to subject many types of complex circuit boards to in-circuit testing, i.e., to the introduction and sensing of signals at "interior" nodes, which are not brought out to the board's edge connector. Such in-circuit testing requires probing of a large number of test points on the board, each of which must be driven or sensed by test instruments. Fortunately, the number of instruments that a tester needs to employ for in-circuit testing is typically much lower than the number of test points; since only a single device or group thereof is typically tested at one time, only a relatively small subset of the test points needs to be driven and/or sensed simultaneously. Consequently, connections of the instruments to probes by which signals are coupled between the instruments and test points can be made by way of switch circuitry, often referred to in the art as "scanners," that enables a given instrument to be coupled to different test points at different times during a given board's in-circuit test.

The use of such multiplexing thus limits the required amount of tester resources, but resource requirements are nonetheless high on testers capable of performing sufficiently comprehensive in-circuit tests of some of the most-complex circuit boards.

SUMMARY OF THE INVENTION

I have recognized that further resource reduction can be achieved by reducing the number of system contacts required for a given number of board test points.

The typical tester provides its scanner circuitry between the instruments and a set of system contacts physically arranged in a pattern that typically is regular and independent of the board to be tested. The system contacts mate with corresponding fixture contacts connected one-to-one by internal fixture wiring to board test points. (The typical probe is a spring-loaded direct-contact probe, which is placed into actual physical contact with a test point, typically provided on one of the board's conductive tracks. However, probes can also be used that couple capacitively or inductively to test points that are not necessarily actual board tracks but may, for instance, be lead-frame conductors inside electronic-device packages.) By recognizing that the fixture can instead be so wired that it connects pairs of probes to the same fixture contacts, I have made it possible to reduce the number of system contacts required for a given number of board test points. Thus, my invention in its broadest aspect is to connect a plurality of probes to a common fixture contact.

Additional aspects of my invention involve connecting probes in accordance with probe-pairing exclusion rules that tend to prevent such probe connections from impairing the tester's ability to perform the necessary tests. In accordance with one exclusion rule, for instance, probe pairs can be connected only if the probes' respective board tracks are not connected to pins of devices disposed on the board less than a predetermined "physical distance" from each other, the "physical distance" being defined in accordance with the particular rule adopted. Alternatively, or in addition, connection can be restricted to probe pairs whose respective nodes are separated from each other by more than a predetermined "electrical distance" defined in accordance with the pairing rule. Further rules based on other topological or device-type considerations will typically also be imposed.

BRIEF DESCRIPTION OF THE DRAWINGS

The above and further advantages of the invention may be better understood by referring to the following description in conjunction with the accompanying drawings, in which.

DETAILED DESCRIPTION OF AN ILLUSTRATIVE EMBODIMENT

Figure 1:
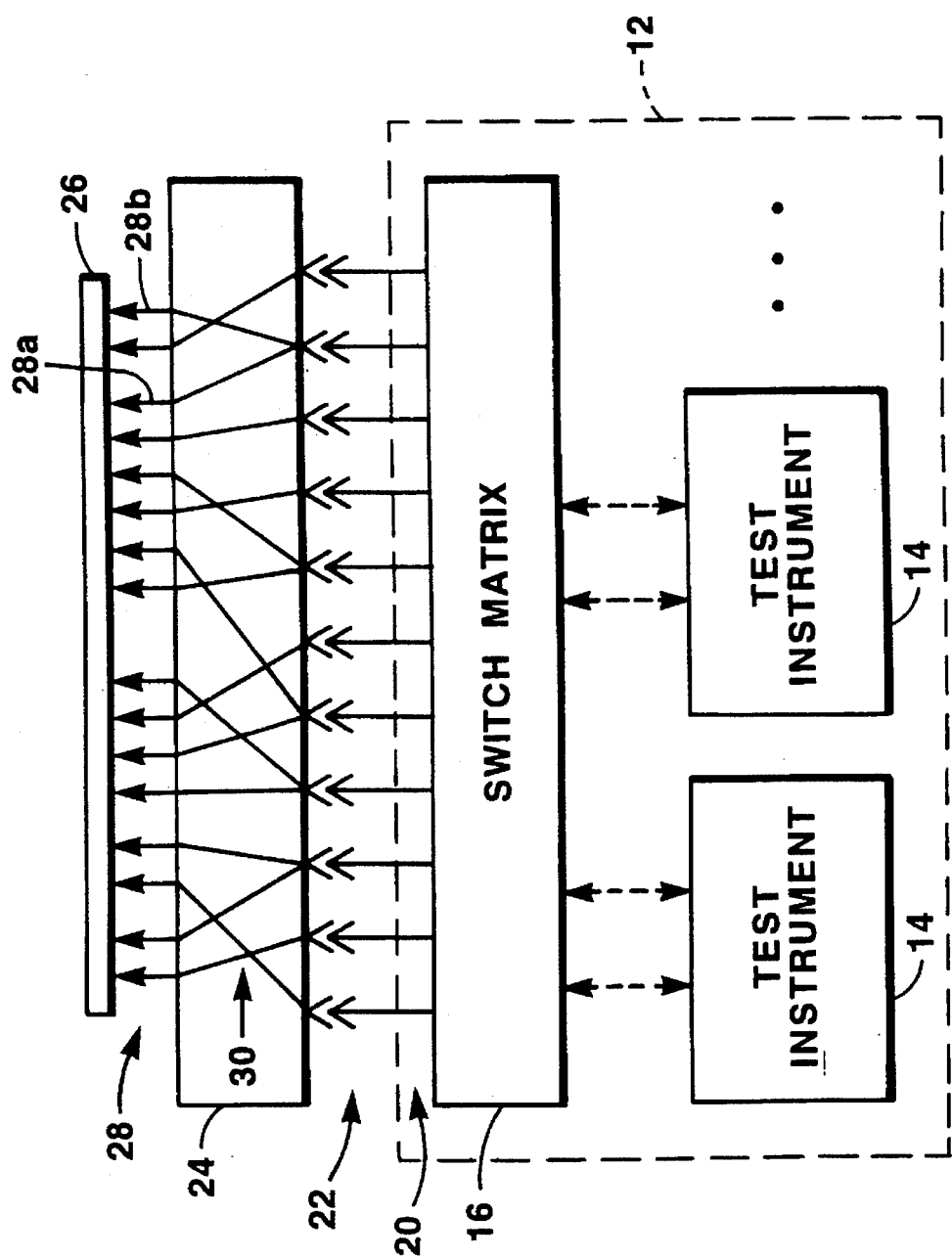
FIG. 1 is a diagrammatic representation of the combination of a general-purpose circuit tester with a circuit board and board-specific test fixture.

FIG. 1 depicts in simplified form a typical board-test setup, in which a general-purpose tester 12 includes various test instruments 14 connected by means of an appropriate switch matrix 16 to system contacts, or "pins" 20. (For the balance of the discussion, we will use the more popular term pin instead of contact, but it will be recognized that the teachings of the present invention are not limited only to contacts provided as male connector members.)

A corresponding array of fixture pins 22 is provided on one side of a fixture 24. The fixture 24 is custom built to secure a particular type of circuit board 26 to be tested and provide probes 28 at locations specific to test points on that particular board type. But the fixture pins 22 are typically arranged physically in a more or less regular (and board-independent) array so as to enable them to mate with the corresponding regular array of system pins 20. Connections between the board-specific probe locations and the board-independent fixture-pin locations are made by wiring 30. In prior-art fixtures, there is typically a one-to-one correspondence between fixture pins 22 and probes 28. But in accordance with the present invention, at least a pair of probes 28a and 28b are wired together and thus to the same fixture pin 22. This means that the number of fixture pins—and thus the number of system pins—can be less than the number of test points required for an adequate test of the board.

Given that probes will thus be paired, the question is which probes to connect to which others. One approach to probe pairing is to start with all possible pairs, use exclusion rules such as those to be set forth below to exclude some of those candidate pairs from consideration, and then connect some or all of the pairs that remain. (We refer here to "pairs" because the exclusion rules will typically be applied to two probes at a time. But connections among more than two probes may thereby result. If it is determined that probe pair AB can be connected and that probe pair BC can be connected, then both of those connections can be made only if it is also determined that pair AC can also be connected.)

Although it is theoretically possible to start with all possible pairs and then use the exclusion rules to reduce the number of candidates, most embodiments of the invention will typically be designed by proceeding in a slightly different manner. For one thing, it may not be practical to take the time to apply the exclusion rules to all theoretically possible probe pairs; the number of possible probe pairs is $(N)(N-1)/2$, where N is the number of probes, so the number of probe pairs can be quite large for a complicated board.

Additionally, it may be convenient for only pairs having certain desirable characteristics to make up the pair set to which the exclusion rules are applied. For instance, it may be desired to perform tests on two (or more) identical devices simultaneously, and it may therefore be convenient to connect together the identical devices' corresponding test points to the extent possible.

It will become apparent as the description proceeds that the exclusion rules described here are, taken together, more restrictive than necessary. Consequently, they can be modified, and some can be eliminated entirely. Their purpose is simply to preserve the ability of the tester to perform various types of tests.

The first such rule is that power, ground, and reference-voltage nodes should be contacted only by probes that are not wired in the fixture to other probes.

Another, "physical-distance" rule, is used to preserve the tester's ability to perform short-circuit tests between various combinations of test points. Such a test cannot be made if the fixture itself has shorted together the probes that contact those test points. Indeed, almost no probes at all can be wired together if there is to be a 100% short-circuit test, i.e., a test in which each test point is tested for a short circuit to every test point to which it should not be connected in a good board.

But I have recognized that such 100% testing for short circuits is unnecessary. The chance that a short circuit will occur between two board tracks is very small if the tracks do not pass close to each other at their closest points. One could therefore take advantage of this fact by imposing an exclusion rule in accordance with which two probes cannot be connected together in the fixture if they contact test points on tracks that pass within a predetermined limit distance of each other.

However, I do not employ such an exclusion rule. A bare-board test for short circuits will ordinarily have already been conducted before in-circuit testing is performed, so all such short circuits not caused by device pins will already have been eliminated or excluded, and the board tracks will largely have been coated with an insulating layer. So I prefer to employ a different exclusion rule, one which is based only upon the likelihood that short circuits will occur between one device pin or exposed (uncoated) via and another pin or via.

Figure 2:
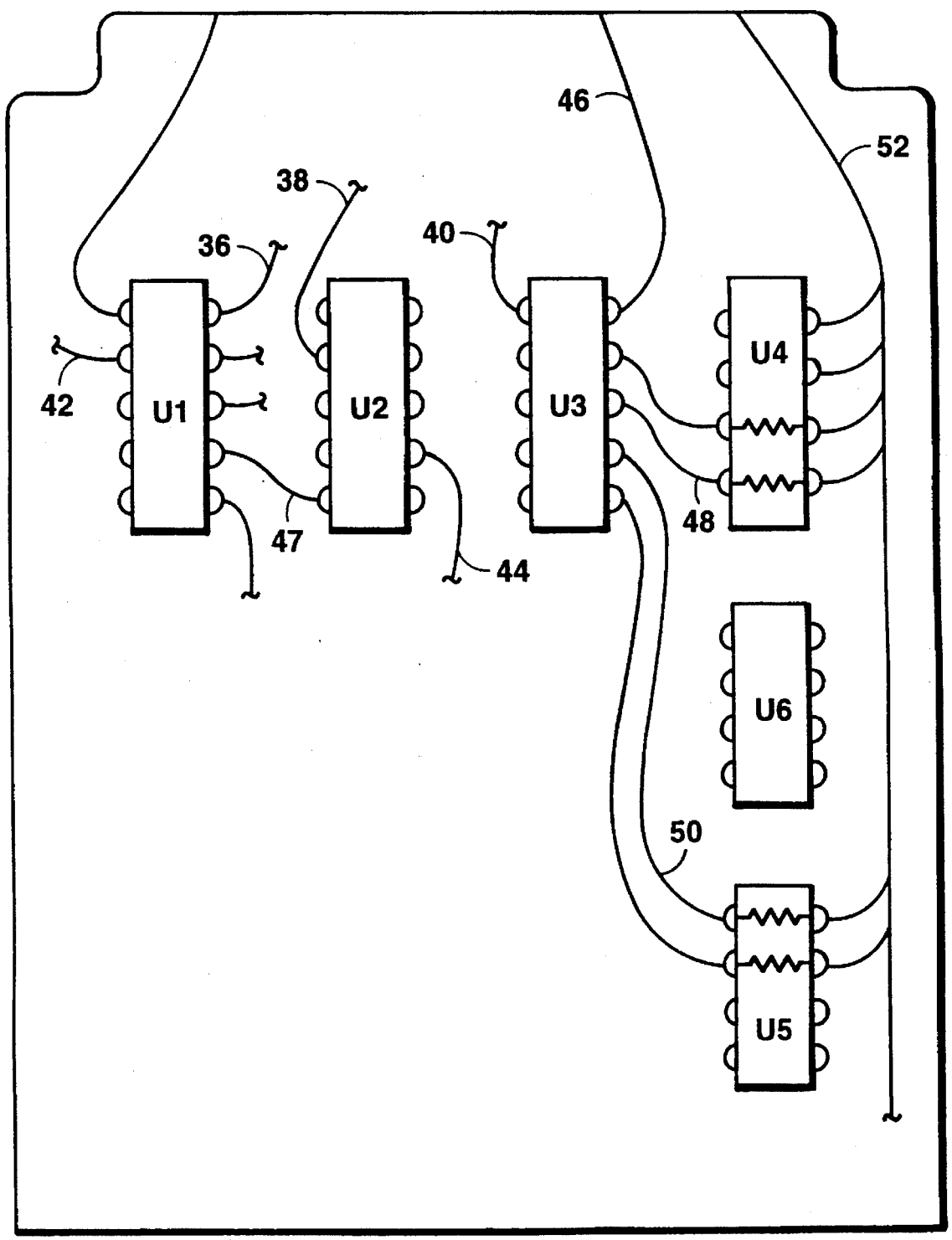
FIG. 2 is a diagrammatic representation of a circuit board of the type that may be tested in accordance with the teachings of the present invention.

In accordance with this rule, first and second probes cannot be connected in the fixture if an exposed via or device to which the first probe's board track is connected is disposed less than a predetermined limit distance from a via or device to which the second probe's board track is connected. In FIG. 2, for instance, probes connected together in the fixture cannot contact nodes 36 and 38, since those nodes are connected to pins of devices U1 and U2, which are disposed physically dose together. Because those devices are physically dose, locations at which those nodes are exposed, namely, where they are connected to the device pins, are also likely to be dose physically. On the other hand, this rule does not prohibit connected-together probes from contacting nodes 36 and 40, since devices U1 and U3 are farther apart. The limit "distance" employed in this rule can be relative: for instance, one may deem two board devices to be within the limit distance of each other if a straight line drawn from one to the other does not go through any intervening device.

Other physical-distance criteria can be used instead in accordance with the broader aspects of this invention. In particular, inspection of FIG. 2 reveals that the rule just described is likely to be more restrictive than necessary. It would prevent pairing of the probe contact nodes 42 and 44, because those nodes are connected to physically close devices U1 and U6. Yet there is little likelihood that short circuits will occur between the exposed parts of nodes 42 and 44, since they are connected to pins at opposite sides of their respective devices. Clearly, such factors can be taken into account in designing the exclusion rules, but, for the sake of simplicity, I have not done so.

It should be noted that a node for the purpose of the exclusion rules includes not only a single board track but also all tracks placed into communication with it by the fixture wiring. So the number of devices considered in accordance with this rule to be connected to a given node may increase after a given pairing has been decided upon. The reason for considering nodes to be thus extended is that pairing the probes potentially requires that isolation be practiced on the input ports of an additional, previously electrically distant device. A candidate probe pairing may therefore be eliminated from consideration even though it ostensibly has passed the exclusion-rule tests by itself if making the candidate connections would cause previously acceptable—and accepted—pairings to violate the exclusion rule.

While the physical-distance exclusion rule is imposed to preserve the tester's ability to perform necessary short-circuit tests, another exclusion rule, which I refer to as an "electrical distance" rule, has as its purpose preservation of the tester's ability to perform certain "isolation" functions employed in a typical in-circuit test. In a typical in-circuit test, signals are applied to nodes occupied by input pins of the device under test, and signals are sensed at nodes occupied by that device's output pins. But the device under test in an in-circuit test is by definition connected by the board to other devices. These other devices—which are unavoidably powered up—complicate the process of applying the desired input signals: a neighboring device may be attempting to place an input node of the device under test into a state different from that to which it should be placed in accordance with the test. Steps taken to overcome such interference are sometimes referred to as isolation.

Testers practice isolation partially by backdriving, i.e., by using a very-low-output impedance driver in the tester to drive the node that the neighboring device is attempting to drive. The tester thereby overcomes the drive capability of the neighboring device and drives the node to the level that the test dictates.

However, the extent to which this technique can be employed is limited. For one thing, backdriving can cause significant power dissipation, and board devices generally can tolerate only a limited amount of the resultant heating. Furthermore, the "low-output-impedance" drivers used in the tester typically have a somewhat higher impedance to the high-frequency components that occur at the edges of certain pulses. And there are a few types of devices whose output impedances are so low as to make backdriving impractical.

For all these reasons, the backdriving technique must be supplemented by techniques that make some backdriving unnecessary. They do this by applying signals to the input ports of neighboring devices in such a manner as to prevent those devices from attempting to produce outputs whose interference with test inputs would make backdriving necessary. For instance, if driving the neighboring device's output-enable input port can "tristate" the interfering output pin—i.e., disable it so as to place it into a high-output-impedance state—then backdriving is not necessary at that pin's node, and the resultant power dissipation and device heating are thereby avoided.

It is to preserve the ability of the tester to perform such isolation techniques that I also impose an exclusion rule based on an "electrical distance" criterion. The electrical distance between two nodes in the present context is determined by performing a "walk" from the one node to the other along a path that includes only signal nodes or devices that connect them: the "walk" can proceed from one signal node to another only if the same device has pins connected to both of those nodes. (A signal node as used here is a node other than a ground or power node; almost all devices are connected to the same ground or power node.) The electrical distance between two nodes in accordance with this definition is the number of devices thus encountered in performing the "walk" between the two nodes. And the electrical-distance exclusion rule is that the fixture cannot connect two probes if the nodes contacted by those probes are less than a predetermined electrical distance apart. For instance, I propose to use an electrical-distance limit of two; i.e., two probes cannot be connected together unless more than two components are crossed in a "walk" from the node contacted by one of the probes to the node contacted by the other.

In the particular embodiment illustrated here, I do not impose the electrical-distance criterion universally, as I do the physical-distance criterion. Part of the reason for this is that I treat what I call "peripheral" nodes separately from what I call "internal" nodes in this embodiment. A peripheral node is a node that is connected only to one or more device input ports or only to one or more device output ports but not to both. I call such nodes "peripheral" because they typically are brought out to a connector on the board. Node 46, for instance, may be such a node. In order to retain diagnostic resolution, I prefer not to wire a fixture probe that contacts a peripheral node to a fixture probe that contacts what I refer to as an internal node, i.e., a node that is connected to device input and device output pins both. Node 47 may be such a node. This separate treatment preserves isolation capability as far as the peripheral nodes are concerned, so I apply the electrical-distance criterion only to internal nodes.

In addition to the peripheral-node and internal-node classes, I also treat separately a third, "pull-up" class of nodes. Pull-up nodes are nodes that, although they might otherwise have been classified as peripheral or internal nodes, I exclude from those classes because they are connected through resistors to reference nodes, such as power or ground nodes. Nodes 48 and 50, which are respectively connected to different "R packs" U4 and U5, would fall into this category because the R packs connect them through resistors to a power ("$V_{CC}$") node 52. Unlike other nodes, which are not considered in accordance with the electrical-distance rule to be electrically close just because they are both connected to pins of devices connected to the same ground or power node, all pull-up nodes are considered too close to be contacted by tied-together probes. The reason for this is that pull-up resistors must often be tested for resistance, and connecting pull-up nodes together would effectively wire pull-up resistors completely in parallel with each other and prevent them from being measured separately.

In addition to these rules based more or less on general topological classes, I exclude further possible pairs by applying rules based on particular device types. For instance, I do not pair probes that contact nodes occupied by devices of different logic families. For example, a node connected to a pin of a transistor-transistor-logic (TTL) device and a node connected to a pin of an emitter-coupled-logic (ECL) device should not be contacted by probes that the fixture wires together. Although some situations undoubtedly occur in which such probe pairings would not prevent a proper test, avoiding such pairings makes sense as a rule of thumb.

Additionally, those skilled in in-circuit testing recognize that certain nodes just generally require special treatment. For instance, nodes driven by high-drive-current output pins can present difficulties, particularly during the interval before the board is reset during the power-up sequence. So probes that are to contact such nodes should not be paired with other nodes. Some nodes are recognized as being subject to oscillation when they are backdriven, and it is a good rule of thumb to avoid wiring probes connecting such nodes, too, with probes that contact other nodes. Similarly, a probe that contacts a node connected to a pin that will result in a damaged device if it is backdriven should not be wired in the fixture to another probe.

Another rule is to avoid having connected probes contact nodes connected to pins of a common device. Obviously, application of the electrical-distance rule will prevent such pairings, but I mention it here specifically because, as was mentioned above, most of the rules that I impose are actually more restrictive than is necessary, and the broader aspects of the invention can be practiced without imposing all of them. If the electrical-distance rule is not followed strictly, therefore, one may want additionally to employ this rule not only for peripheral-node probes but also for internal-node probes. (Since no pull-up-node probes are tied together, applying this rule separately to such nodes would be superfluous.)

Effective testing often depends on the ability of the tester to place board devices in known states, and probes should not be tied together in such a way as to defeat the ability to accomplish this readily. Accordingly, a further rule of thumb is not to pair any probes that are to contact nodes occupied by enable pins, dock pins, and reset pins It was mentioned above that I apply certain rules only to internal-node probes. One of these rules is that the back-driving load imposed by the nodes of connected-together probes should not exceed the tester's backdrive capabilities. Similarly, probes should not be connected together if to do so would load any board-under-test device output port beyond its fan-out capabilities.

To maintain fault coverage, care needs to be taken if probes that contact internal nodes are connected together. In such a case, it is desirable for the contacted nodes to be ones that are driven only by separately tristatable device ports; if one is tristated, its output will not mask the other's output. Even if the ports that drive the connected-together nodes are not tristatable, however, it may still be possible to maintain fault coverage by using established known current-sensing techniques. Such techniques will not be discussed in detail here, since those skilled in the art are familiar with them. We mention here only that in such techniques the tester drives the output node to an intermediate level and observes whether current changes occur when a device is so operated that the state of one of the pins that drives the output node should change if that pin's device is operating properly. By observing whether any current change results, it is possible to test separately individual ones of devices that drive a common node.

As a final example of one of the rules that might be employed is to require probes that contact respective nodes of a multi-line bus, such as a microprocessor data bus, not be tied together. The purpose for this rule is that such buses typically should be permitted to assume levels that represent any possible bit combination. This would not be possible if the fixture connects together the probes that contact them.

From the foregoing discussion, it is apparent that connecting fixture probes together can reduce the resource requirements for a given board and that fault coverage can nonetheless be maintained by imposing appropriate priority rules. The present invention thus constitutes a significant advance in the art.

What is claimed is:

1. For use with an automatic circuit tester that comprises a plurality of test instruments, each of which includes at least one instrument terminal for sensing a signal on a node connected thereto or driving an instrument output signal onto a node connected thereto, the circuit tester further including a set of system contacts connectable by the tester to the instrument terminals and adapted for engagement of fixture contacts, a fixture comprising:

A) a set of fixture contacts so disposed with respect to each other as to permit simultaneous contact with respective ones of the system contacts;

B) a set of probes so disposed with respect to each other as to enable them to contact respective test points on a circuit board simultaneously; and C) connection wiring for electrically connecting each of a plurality of the fixture contacts to respective probes in such a manner as to connect at least a pair of the probes to the same fixture contact.

2. For use with an automatic circuit tester that comprises a plurality of test instruments, each of which includes at least one instrument terminal for sensing a signal on a node connected thereto or driving an instrument output signal onto a node connected thereto, the circuit tester further including a set of system contacts connectable by the tester to the instrument terminals and adapted for engagement of fixture contacts, a circuit-test assembly comprising:

A) a circuit board comprising:
 i) a substrate providing conductive tracks that embody electrical nodes and provide test points thereon; and
 ii) a plurality of electrical devices comprising device pins secured to respective ones of the tracks; and B) a fixture mounting the circuit board and comprising:
 i) a set of fixture contacts so disposed with respect to each other as to enable them to contact respective ones of the system contacts simultaneously;
 ii) a set of probes coupled simultaneously to respective test points on the circuit board; and
 iii) connection wiring for so electrically connecting each of a plurality of the fixture contacts to respective probes as to connect at least a pair of the probes to the same fixture contact without connecting any fixture contact to a pair of probes whose respective tracks are connected to device pins of the same electrical device.

3. For use with an automatic circuit tester that comprises a plurality of test instruments, each of which includes at least one instrument terminal for sensing a signal on a node connected thereto or driving an instrument output signal onto a node connected thereto, the circuit tester further including a set of system contacts connectable by the tester to the instrument terminals and adapted for engagement of fixture contacts, a circuit-test assembly comprising:

A) a circuit board comprising:
 i) a substrate providing conductive tracks that embody electrical nodes and provide test points thereon; and
 ii) a plurality of electrical devices comprising device pins secured to respective ones of the tracks, at least some of the electrical devices being disposed within a predetermined limit distance of each other; and B) a fixture mounting the circuit board and comprising:
 i) a set of fixture contacts so disposed with respect to each other as to enable them to contact respective ones of the system contacts simultaneously;
 ii) a set of probes coupled simultaneously to respective test points on the circuit board; and
 iii) connection wiring for so electrically connecting each of a plurality of the fixture contacts to respective probes as to connect at least a pair of the probes to the same fixture contact without connecting any fixture contact to a pair of probes whose respective tracks are connected to device pins of board devices located within the predetermined limit distance of each other.

* * * * *